(12) United States Patent
Lee et al.

(10) Patent No.: US 10,347,803 B2
(45) Date of Patent: Jul. 9, 2019

(54) LIGHT EMITTING DEVICE PACKAGE AND LIGHT SYSTEM INCLUDING THE SAME

(71) Applicant: LG INNOTEK CO., LTD., Seoul (KR)

(72) Inventors: Eun Dk Lee, Seoul (KR); Jung Hun Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 355 days.

(21) Appl. No.: 14/931,140

(22) Filed: Nov. 3, 2015

(65) Prior Publication Data
US 2016/0133804 A1    May 12, 2016

(30) Foreign Application Priority Data

Nov. 10, 2014 (KR) .................. 10-2014-0155156
Jan. 14, 2015 (KR) .................. 10-2015-0006651

(51) Int. Cl.
| | | |
|---|---|---|
| H01L 33/54 | (2010.01) | |
| H01L 33/56 | (2010.01) | |
| H01L 33/58 | (2010.01) | |
| H01L 33/48 | (2010.01) | |

(52) U.S. Cl.
CPC ............. *H01L 33/54* (2013.01); *H01L 33/56* (2013.01); *H01L 33/58* (2013.01); *H01L 33/486* (2013.01); *H01L 2224/48091* (2013.01); *H01L 2224/48247* (2013.01); *H01L 2224/48257* (2013.01); *H01L 2224/8592* (2013.01); *H01L 2924/181* (2013.01); *H01L 2924/18301* (2013.01)

(58) Field of Classification Search
CPC ......... H01L 33/54; H01L 33/56; H01L 33/58; H01L 33/486; H01L 2924/00012; H01L 2924/00014; H01L 2924/181; H01L 2924/18301; H01L 2224/48091; H01L 2224/48247; H01L 2224/48257; H01L 2224/8592
USPC .................................................. 257/98, 100
See application file for complete search history.

(56) References Cited

U.S. PATENT DOCUMENTS

| | | | |
|---|---|---|---|
| 2003/0040245 A1* | 2/2003 | Song ................ | H01J 9/242 445/24 |
| 2005/0072981 A1 | 4/2005 | Suenaga | |
| 2005/0218421 A1 | 10/2005 | Andrews et al. | |
| 2008/0029775 A1 | 2/2008 | Liu et al. | |

(Continued)

FOREIGN PATENT DOCUMENTS

| | | |
|---|---|---|
| CN | 202084573 | 12/2011 |
| CN | 102318091 | 1/2012 |
| JP | WO 2009/066670 A1 | 5/2009 |

OTHER PUBLICATIONS

European Search Report issued in Application No. 15193708.1 dated Mar. 22, 2016.

(Continued)

*Primary Examiner* — Vongsavanh Sengdara
(74) *Attorney, Agent, or Firm* — Ked & Associates, LLP

(57) ABSTRACT

A light emitting device package may include a package body, a light emitting device on the package body, a first molding member that surrounds the light emitting device, and a second molding member having a hemi-spherical structure to surround the first molding member. The molding member includes a viscous material.

12 Claims, 11 Drawing Sheets

(56) References Cited

U.S. PATENT DOCUMENTS

| | | | |
|---|---|---|---|
| 2009/0267093 A1* | 10/2009 | Kamada | H01L 33/483 |
| | | | 257/98 |
| 2010/0230693 A1 | 9/2010 | Tran | |
| 2010/0277932 A1 | 11/2010 | Chen et al. | |
| 2013/0069088 A1* | 3/2013 | Speck | H01L 33/385 |
| | | | 257/88 |
| 2013/0270590 A1* | 10/2013 | Chang | H01L 33/58 |
| | | | 257/98 |
| 2013/0334554 A1* | 12/2013 | Kong | G02B 6/0031 |
| | | | 257/98 |

OTHER PUBLICATIONS

Chinese Office Action dated Sep. 4, 2018 issued in CN Application No. 201510757038.8.

* cited by examiner

LIGHT EMITTING DEVICE PACKAGE AND LIGHT SYSTEM INCLUDING THE SAME

CROSS-REFERENCE TO RELATED APPLICATIONS

This application claims priority under 35 U.S.C. § 119 to Korean Application Nos. 10-2014-0155156, filed on Nov. 10, 2014, and 10-2015-0006651, filed on Jan. 14, 2015, whose entire disclosures are incorporated herein by reference.

BACKGROUND

1. Field

The embodiment relates to a light emitting device package, and a light system including the same.

2. Background

A light emitting diode (LED) includes a P-N junction diode having a characteristic of converting electric energy into light energy and may be formed by using compound semiconductors of group III-V elements on the periodic table. An LED may emit various colors by adjusting the compositional ratio of the compound semiconductors.

When a forward voltage is applied to an LED, as electrons of an N layer are combined with holes of a P layer, energy is released across an energy gap between a conduction band and a valence band. In the case of the LED, the energy is released in the form of light.

For example, nitride semiconductors have been highlighted in the field of optical devices and high-power electronic devices due to their excellent thermal stability and wide bandgap energy. Blue, green, and ultraviolet (UV) light-emitting devices employing nitride semiconductors have already been commercialized and extensively used.

An LED may be mounted in a light emitting device package to receive power applied thereto from an external printed circuit board (PCB), and a lens may be generally used to improve the efficiency of the emitted light. However, an LED using the lens may be cracked, resulting in reduction of light emission.

BRIEF DESCRIPTION OF THE DRAWINGS

The embodiments will be described in detail with reference to the following drawings in which like reference numerals refer to like elements wherein.

DETAILED DESCRIPTION

Figure 1:
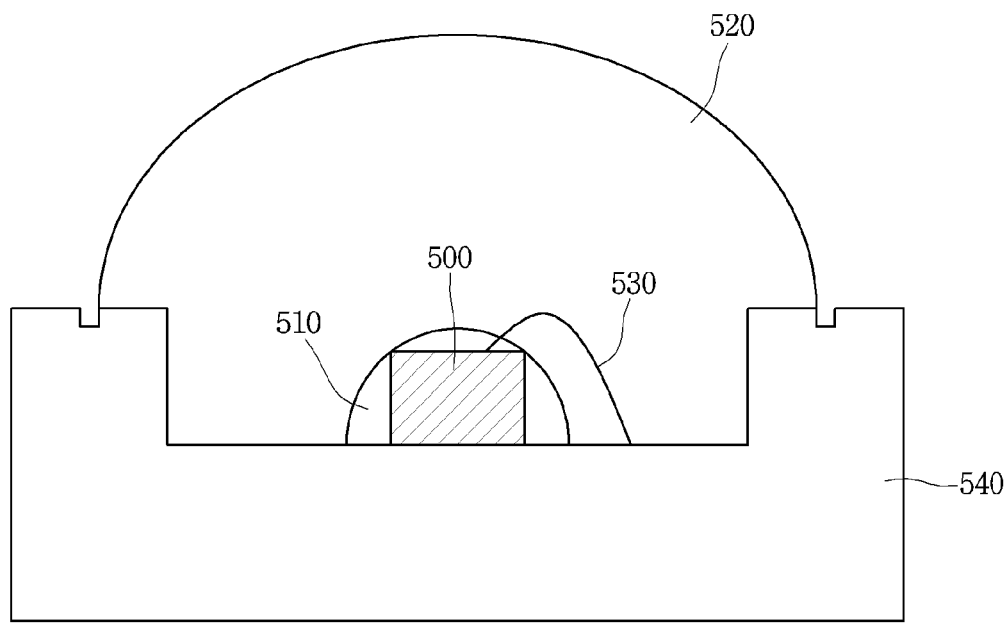
FIG. 1 is a sectional view showing a light emitting device package according to the embodiment.

FIG. 1 is a sectional view showing a light emitting device package according to the embodiment. The light emitting device package according to the embodiment may include a package body 540, a light emitting device 500 on the package body 540, a first molding member 510 to surround the light emitting device 500, a second molding 520 to surround the first molding member 510, and a wire 530 to electrically connect the package body 540 with the light emitting device 500.

The package body 540 may include a silicon material, a synthetic resin material, or a metallic material. An inclined surface may be formed around the light emitting device 500. The light emitting device 500 may be mounted on the package body 540 and may be electrically connected with the package body 540 through the wire 530. The light emitting device 500 may include a vertical type of a light emitting device, but the embodiment is not limited thereto. The light emitting device 500 may include a lateral type of a light emitting device.

The light emitting device 500 may be electrically connected with the package body 540 through a wire scheme, a flip-chip scheme, and/or a die-bonding scheme. Although the electrical connection of the light emitting device 500 through the wire is provided for an illustrative purpose, the embodiment is not limited thereto. The light emitting device 500 may emit light having an ultra-violet wavelength band, but the embodiment is not limited thereto.

The first molding member 510 and the second molding member 520 may surround the light emitting device 500 to protect the light emitting device 500. In addition, the first molding member 510 and the second molding member 520 may include phosphors to change the wavelength of the light emitted from the light emitting device 500.

The first molding member 510 may include a viscosity material, or a silicon-based material, but the embodiment is not limited thereto. The first molding member 510 may have a hemi-spherical structure. The second molding member 520 may have hardness greater than that of the first molding member 510 and may include an epoxy-based material or a silicon-based resin, but the embodiment is not limited thereto.

The first molding member 510 may have a curvature equal to that of the second molding member 520, but the embodiment is not limited thereto. The curvature of the first molding member 510 may be different from that of the second molding member 520.

Figure 2:
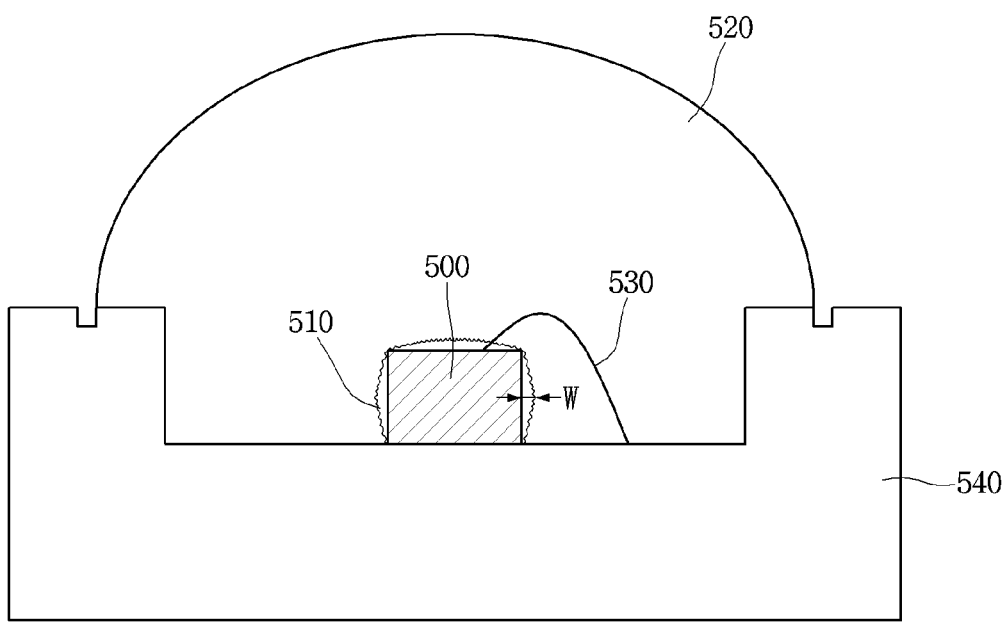
FIG. 2 is a sectional view showing a light emitting device package according to another embodiment.

FIG. 2 is a sectional view showing a light emitting device package according to another embodiment. The light emitting device package according to another embodiment may include a package body 540, a light emitting device 500 on the package body 540, a first molding member 510 to surround the light emitting device 500, a second molding member 520 to surround the first molding member 510, and a wire 530 to electrically connect the package body 540 with the light emitting device 500. In this case, the first molding member 510 may be formed by dotting silicon-based resin having viscosity to an upper portion of the light emitting device 500. That is, the first molding member 510 may surround the light emitting device 500 and may include patterns. The patterns may be randomly formed, but the embodiment is not limited thereto.

The first molding member 510 may have a coating thickness W in the range of 70 μm to 100 μm, but the embodiment is not limited thereto. When the coating thickness of the first molding member 510 is less than 70 μm, the first molding member 510 may be easily cracked. When the coating thickness of the first molding member 510 exceeds 100 μm, light is absorbed so that the light efficiency may be lowered.

Figure 3:
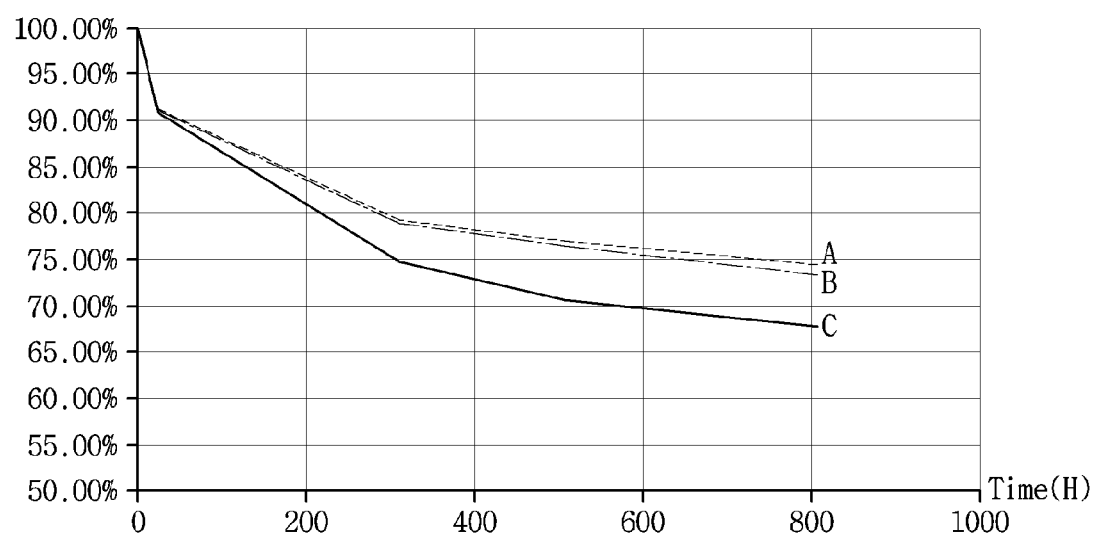
FIG. 3 is a graph to explain the frequency of crack occurrence of the light emitting device package according to the embodiment.

FIG. 3 is a graph to explain the frequency of crack occurrence of the light emitting device package according to the embodiment. A first plot A, a second plot B, and a third plot C show percentage of cracking as a function of testing time to show frequency of crack occurrence of the light emitting device package. The light emitting device package according to the embodiment has crack occurrence frequencies of 82.5%, 75%, 73%, and 72% after 200, 400, 600, and 800, hours respectively. According to the light emitting device package of the embodiment, the frequency of crack occurrence may be lowered by making the first molding member 510 viscous and the second molding member 520 have a hardness greater than that of the first molding member 510.

Figure 4:
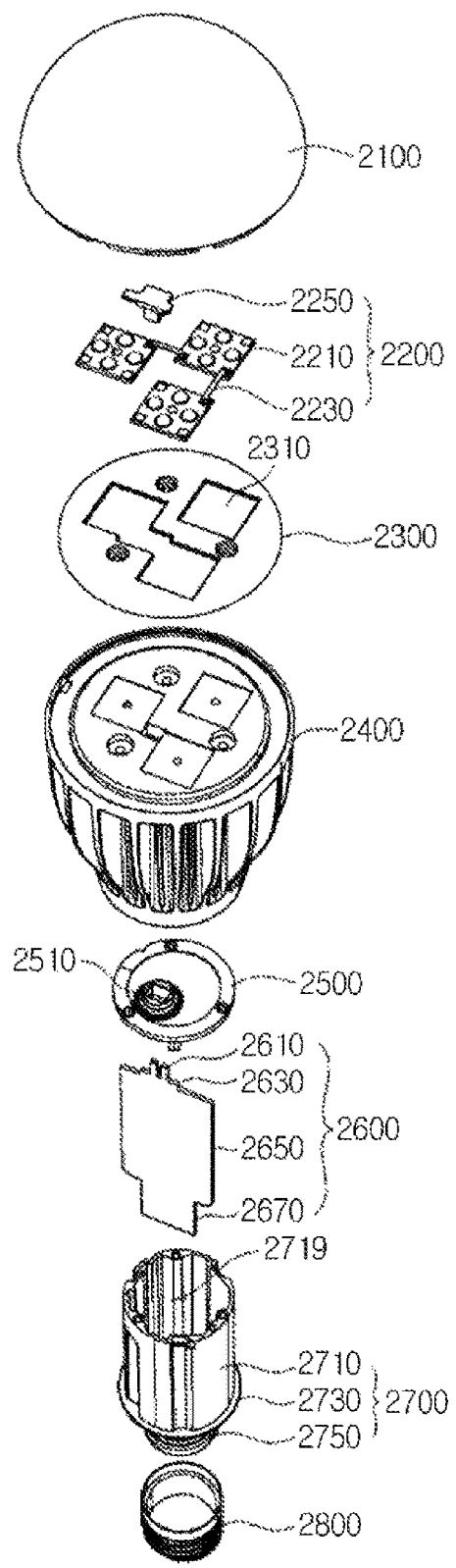
FIGS. 4 and 5 are exploded perspective views showing examples of a light system including a light emitting device package according to the embodiment.
Figure 5:
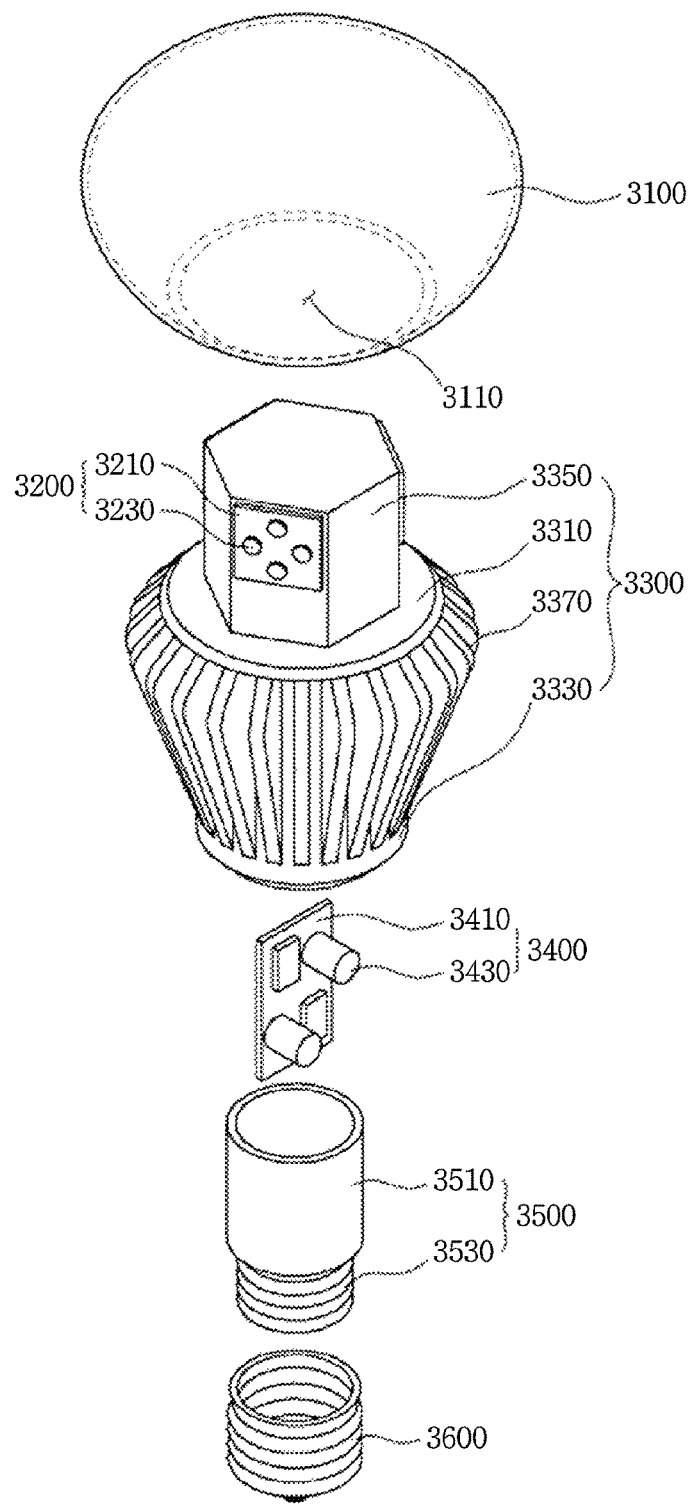

FIGS. 4 and 5 are exploded perspective views showing examples of a light system including a light emitting device package according to the embodiment. As shown in FIG. 4, the light system may include a cover 2100, a light source module 2200, a radiator 2400, a power supply part 2600, an inner case 2700, and a socket 2800. In addition, the light system may further include at least one of a member 2300 and a holder 2500. The light source module 2200 may include a light emitting device 100 or a light emitting device package 200 according to the embodiment.

For example, the cover 2100 may have a bulb shape, a hemisphere shape, and/or a partially-open hollow shape. The cover 2100 may be optically coupled to the light source module 2200. The cover 2100 may diffuse, scatter, or excite light provided from the light source module 2200. The cover 2100 may be a type of optical member. The cover 2100 may be coupled to the radiator 2400. The cover 2100 may include a coupling part which is coupled to the radiator 2400.

The cover 2100 may include an inner surface coated with milk-white paint. The milk-white paint may include a diffusion material to diffuse light. The cover 2100 may have the inner surface with a rougher surface than that of the outer surface. The surface roughness may be for scattering and diffusing the light from the light source module 2200.

For example, a material of the cover 2100 may include glass, plastic, polypropylene (PP), polyethylene (PE), and polycarbonate (PC). Polycarbonate (PC) has superior light resistance, heat resistance and strength among the above materials. The cover 2100 may be transparent so that a user may view the light source module 2200 from the outside, or the cover 2100 may be opaque. The cover 2100 may be formed through a blow molding scheme.

The light source module 2200 may be provided at one surface of the radiator 2400. Accordingly, the heat from the light source module 2200 may be conducted to the radiator 2400. The light source module 2200 may include a light source 2210, a connection plate 2230, and a connector 2250.

The member 2300 may be provided at a top surface of the radiator 2400 and may include guide grooves 2310 into which a plurality of light sources 2210 and the connector 2250 are inserted. The guide grooves 2310 correspond to a substrate of the light source 2210 and the connector 2250.

A light reflective material may be applied to or coated on a surface of the member 2300. For example, white paint may be applied to or coated on the surface of the member 2300. The member 2300, then, may reflect light, which is, in turn, reflected by the inner surface of the cover 2100 and returned to the direction of the light source module 2200 and the cover 2100. Thus, the light efficiency of the light system according to the embodiment may be improved.

The member 2300 may include an insulating material. The connection plate 2230 of the light source module 2200 may include an electrically conductive material. Accordingly, the radiator 2400 may be electrically connected to the connection plate 2230. The member 2300 may include an insulating material, thereby preventing the connection plate 2230 from being electrically shorted along with the radiator 2400. The radiator 2400 receives heat from the light source module 2200 and the power supply part 2600 and radiates the heat.

The holder 2500 covers a receiving groove 2719 of an insulating part 2710 of an inner case 2700. The power supply part 2600 received in the insulating part 2710 of the inner case 2700 may be sealed. The holder 2500 has a guide protrusion 2510. The guide protrusion 2510 has a hole through a protrusion 2610 of the power supply part 2600.

The power supply part 2600 processes or converts an external electric signal and provides the processed or converted electric signal to the light source module 2200. The power supply part 2600 is received in the receiving groove of the inner case 2700 and sealed inside the inner case 2700 by the holder 2500.

The power supply part 2600 may include a protrusion 2610, a guide part 2630, a base 2650, and an extension part 2670.

The guide part 2630 may have a shape protruding outward from one side of the base 2650. The guide part 2630 may be inserted into the holder 2500. A plurality of components may be provided on one surface of the base 2650. For example, the components may include a DC converter that converts AC power from an external power supply into DC power, a driving chip that controls driving of the light source module 2200, and/or an ESD protection device that protects the light source module 2200, but the embodiment is not limited thereto.

The extension part 2670 may have a shape protruding outward from an opposite side of the base 2650. The extension part 2670 may be inserted into an inside of the connection part 2750 of the inner case 2700 and may receive an external electric signal. For example, a width of the extension part 2670 may be smaller than or equal to a width of the connection part 2750 of the inner case 2700. One end of a "+ electric wire" and one end of a "− electric wire" may be electrically connected to the extension part 2670, and opposite ends of the "+ electric wire" and the "− electric wire" may be electrically connected to a socket 2800.

The inner case 2700 may include a molding part and the power supply part 2600. The molding part may be formed by hardening molding liquid, and the power supply part 2600 may be fixed into the inner case 2700 by the molding part.

As shown in FIG. 5, the light system according to the embodiment may include a cover 3100, a light source part 3200, a radiator 3300, a circuit part 3400, an inner case 3500, and a socket 3600. The light source part 3200 may include the light emitting device or the light emitting device package according to the embodiment.

The cover 3100 may have a bulb shape in a hollow structure. The cover 3100 has an opening 3110. The light source part 3200 and a member 3350 may be inserted through the opening 3110.

The cover 3100 may be coupled to the radiator 3300 and may surround the light source part 3200 and the member 3350. The light source part 3200 and the member 3350 may be blocked from the outside by coupling the cover 3100 and the radiator 3300. The cover 3100 may be coupled to the radiator 3300 by an adhesive or various schemes, e.g., such as a rotation coupling scheme and a hook coupling scheme. The rotation coupling scheme is a scheme in which a thread of the cover 3100 is coupled to a screw groove of the radiator 3300, and the cover 3100 is coupled to the radiator 3300 by rotating of the cover 3100. The hook coupling scheme is a scheme in which a step of the cover 3100 is inserted into a groove of the radiator 3300 so that the cover 3100 is coupled to the radiator 3300.

The cover 3100 may be optically coupled to the light source part 3200. The cover 3100 may diffuse, scatter, or excite light provided from a light emitting device 3230 of the light source part 3200. The cover 3100 may be a type of an optical member. The cover 3100 may be provided with a phosphor at an inner/outer surface or an inside thereof to excite the light supplied from the light source part 3200.

The cover 3100 may include an inner surface coated with a milk-white paint. The milk-white paint may include a diffusion material to diffuse light. The cover 3100 may have the inner surface with a rougher surface than that of the outer surface. The surface roughness may be for scattering and diffusing the light from the light source part 3200.

A material of the cover 3100 may include glass, plastic, polypropylene (PP), polyethylene (PE), and polycarbonate (PC). Polycarbonate (PC) has excellent light resistance, heat resistance and strength among the above materials. The cover 3100 may include a transparent material that allows the light source part 3200 and the member 3350 to be visible from the outside or an opaque material that prevents the light source part 3200 and the member 3350 from being visible. The cover 3100 may be formed through a blow molding scheme.

The light source part 3200 may be provided on the member 3350 of the radiator 3300 as well as a plurality of light source parts. The light source part 3200 may be provided on at least one of a plurality of lateral sides of the member 3350. In addition, the light source part 3200 may be provided on an upper end of the lateral side of the member 3350.

The light source part 3200 may be provided at three of six lateral sides of the member 3350, but the embodiment is not limited thereto. The light source part 3200 may be provided at all lateral sides of the member 3350. The light source part 3200 may include a substrate 3210 and a light emitting device 3230. The light emitting device 3230 may be provided on one surface of the substrate 3210.

The substrate 3210 has a rectangular plate shape, but the embodiment is not limited thereto. The substrate 3210 may have various shapes. The substrate 3210 may have, e.g., a circular plate shape or a polygonal plate shape. The substrate 3210 may be provided by printing a circuit pattern on an insulator. The substrate 3210 may include a typical printed circuit board (PCB), a metal core PCB, a flexible PCB, and a ceramic PCB. The substrate may have a COB (chips on board) type where LED chips that are not packaged are directly bonded on the PCB. The substrate 3210 may include a material to effectively reflect light, or the surface of the substrate 3210 may have a color, e.g., a gold color or a silver color, to effectively reflect the light. The substrate 3210 may be electrically connected to the circuit part 3400 received in the radiator 3300. For example, the substrate 3210 and the circuit part 3400 may be connected to each other by a wire. The wire may connect the substrate 3210 and the circuit part 3400 to each other through the radiator 3300.

The light emitting device 3230 may include a light emitting device chip to emit red, green, and blue lights or a light emitting device chip to emit UV. The light emitting device chip may be the lateral type or the vertical type. The light emitting device chip may emit one of blue, red, yellow, and green lights.

The light emitting device 3230 may include a phosphor. The phosphor may include at least one of garnet-based phosphors (YAG, or TAG), silicate-based phosphors, nitride-based phosphors, and oxynitride-based phosphors. The phosphor may include at least one of yellow, green, and red phosphors.

The radiator 3300 may be coupled to the cover 3100 to radiate heat from the light source part 3200. The radiator 330 has a predetermined volume and includes a top surface 3310 and a lateral side 3330. The member 3350 may be provided on the top surface 3310 of the radiator 3310. The top surface 3310 of the radiator 3300 may be coupled to the cover 3100. The top surface 3310 of the radiator 3300 may have a shape corresponding to an opening 3110 of the cover 3100.

A plurality of heat radiation pins 3370 may be provided at the lateral side 3330 of the radiator 3300. The heat radiation pin, 3370 may extend outward from the lateral side 3330 of the radiator 3300 or may be connected to the lateral side 3330 of the radiator 3300. The heat radiation pin 3370 may improve heat radiation efficiency by widening a heat radiation area of the radiator 3300. The lateral side 3330 may not include the heat radiation pins 3370.

The member 3350 may be provided on the top surface of the radiator 3300. The member 3350 may be integrated with or coupled to the top surface 3310 of the radiator 3300. The member 3350 may have the shape of a polygonal prism. For example, the member 3350 may have the shape of a hexagonal prism that includes a top surface, a bottom surface, and six lateral sides. The member 3350 may have the shape of a circular prism an elliptical prism, as well as a hexagonal prism. When the member 3350 has the shape of a circular prism an elliptical prism, the substrate 3210 of the light source part 3200 may be a flexible substrate.

Figure 8:
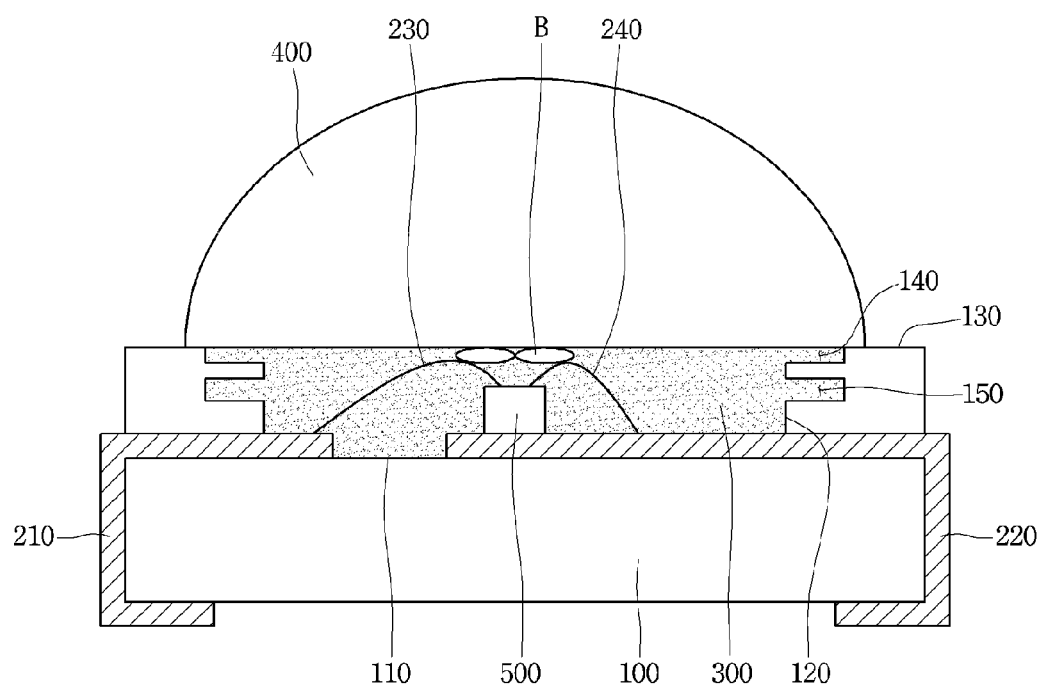
FIGS. 8 to 10 are views showing procedures of trapping air bubbles by an air trap part according to still another embodiment.

The light source part 3200 may be provided at six lateral sides of the member 3350. The light source part 3200 may be provided at all or some of the six lateral sides of the member 3350. The light source part 3200 may be provided at three of the six lateral sides of the member 3350 as shown in FIG. 8.

The substrate 3210 may be provided at the lateral side of the member 3350. The lateral side of the member 3350 may be substantially vertical to the top surface 3310 of the radiator 3300. Accordingly, the substrate 3210 and the top surface of the radiator 3300 may be substantially vertical to each other.

The member 3350 may include a thermally conductive material. Thus, heat from the light source part 3200 can be rapidly transferred to the member 3350. For example, the material for the member 3350 may include aluminum (Al), nickel (Ni), copper (Cu), magnesium (Mg), silver (Ag), tin (Sn), and/or alloys thereof. The member 3350 may include a plastic having thermal conductivity. Plastics with thermal conductivity are lighter than metals and are thermally conductive in one direction.

The circuit part 3400 receives external power and converts the received power for the light source part 3200. The circuit part 3400 then provides the converted power to the light source part 3200. The circuit part 3400 may be provided in the radiator 3300. The circuit part 3400 may be received in the internal case 3500 or may be received in the radiator 3300 together with the internal case 3500. The circuit part 3400 may include a circuit substrate 3410 and a plurality of components 3430 mounted on the circuit substrate 3410.

The circuit board 3410 has a circular plate shape, but the embodiment is not limited thereto. For example, the circuit board 3410 may have an oval plate shape or a polygonal plate shape. The circuit board 3410 may be provided by printing a circuit pattern on an insulator.

The circuit board 3410 may be electrically connected with the substrate 3210 of the light source part 3200. For example, the circuit board 3410 and the substrate 3210 may be electrically connected to each other by a wire. The wire may be provided inside the radiator 3300 to connect the substrate 3210 to the circuit board 3410.

A plurality of components 3430 may include a direct current converter to convert AC power provided from an external power supply into DC power, a driving chip to control the driving of the light source part 3200, and/or an ESD protection device to protect the light source part 3200.

The inner case 3500 receives the circuit part 3400 therein. The inner case 3500 may include a receiving part 3510 to receive the circuit part 3400. The receiving part 3510 may have a cylindrical shape. The shape of the receiving part 3510 may vary depending on the shape of the radiator 3300. The inner case 3500 may be received in the radiator 3300. The receiving part 3510 of the inner case 3500 may be received in a receiving part at a bottom surface of the radiator 3300.

The inner case 3500 may be coupled to the socket 3600. The inner case 3500 may include a connecting part 3530 coupled to the socket 3600. The connecting part 3530 may have a thread structure corresponding to a screw groove structure of the socket 3600. The inner case 3500 may be an insulator. Accordingly, the inner case 3500 prevents electric shortages between the circuit part 3400 and the radiator 3300. For example, the inner case 3500 may include a plastic or resin material.

The socket 3600 may be coupled to the inner case 3500. For example, the socket 3600 may be coupled to the connecting part 3530 of the inner case 3500. The socket 3600 may have the same structure as that of a conventional incandescent light bulb. The socket 3600 may be electrically connected with the circuit part 3400. The circuit part 3400 and the socket 3600 may be electrically connected to each other by a wire. If external power is applied to the socket 3600, the external power may be transferred to the circuit part 3400. The socket 3600 may have a screw groove structure corresponding to a thread structure of the connecting part 3550.

Figure 6:
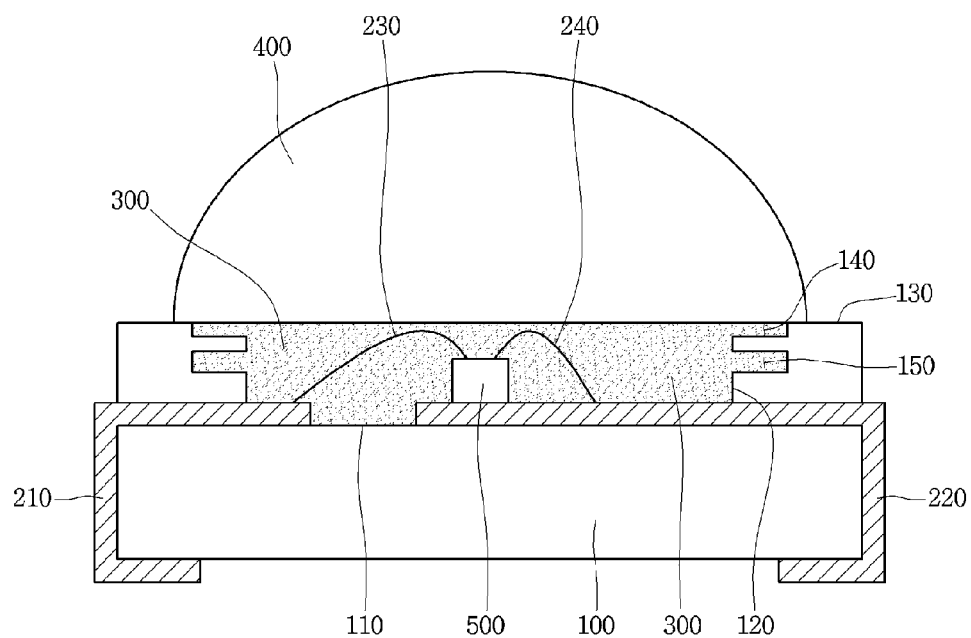
FIG. 6 is a sectional view showing a light emitting device package according to still another embodiment.

FIG. 6 is a sectional view showing a light emitting device package according to still another embodiment. The light emitting device package may include a body part 100 including a cavity, a first electrode 210 and a second electrode 220 provided on the body part 100, a light emitting device 500 provided on the body part 100 and electrically connected to the first electrode 210 and the second electrode 220, a molding member 300 to surround the light emitting device 500, and a lens member 400 provided on the body part 100. The body part 100 may include a silicon material, a synthetic resin material, or a metallic material.

The first electrode 210 and the second electrode 220 may be electrically insulated from each other and may supply power to the light emitting device 500. The first electrode 210 and the second electrode 220 may include a reflective layer to reflect light emitted from the light emitting device 500, thereby increasing light efficiency.

The body part 100 may include the light emitting device 500 provided in a cavity. To form the cavity, the body part 100 may include an internal bottom surface 110 and an internal lateral side 120 to surround the bottom surface 110 and may further include a top surface 130 provided on a circumference of a top surface of the cavity.

The internal lateral side 120 of the body part 100 may be formed in a vertical direction as shown in FIG. 6, but the embodiment is not limited thereto. According to another embodiment, the internal lateral side 120 of the body part 100 may be sloped in a direction so that the width of the cavity is increased. According to another embodiment, the lateral sides around the light emitting device 500 may be formed while gradually increasing in width so that the internal lateral side 120 of the body part 100 deviates from an extraction path of light emitted from the light emitting device 500, thereby improving the light extraction efficiency.

According to still another embodiment, the internal lateral side 120 of the body part 100 may be stepped in a direction so that the width of the cavity is increased. For example, the lateral sides around the light emitting device 500 may also be formed while being gradually increased in width so that the internal lateral side 120 of the body part 100 deviates from an extraction path of light emitted from the light emitting device 500, thereby improving the light extraction efficiency.

A reflection member may be provided in the internal lateral side 120 of the body part 100 to reflect the light emitted from the light emitting device 500 toward the light extraction path, thereby improving the light extraction efficiency.

The light emitting device 500 may be provided on an internal bottom surface 110 of the body part 100. The light emitting device 500 may be electrically connected to the first electrode 210 through a first wire 230. In addition, the light emitting device 500 may be electrically connected to the second electrode 220 through a second wire 240.

The cavity of the body part 100 may be filled with a molding member 300 so that the light emitting device 500 may be surrounded and thus protected by the molding member 300. The molding member 300 according to the embodiment may include a transmissive gel-phase resin or liquid-phase resin. For example, the molding member 300 may include silicon or epoxy. The molding member 300 may also include a filling agent, e.g., $Al_2O_3$ or $TiO_2$. In addition, the molding member 300 may include a phosphor to change the wavelength of the light emitted from the light emitting device 500.

The molding member 300 may have a refractive index in the range of 1.2 to 1.7. The molding member 300 may have a refractive index in the range of 1.3 to 1.6. The molding member 300 having the above refractive index reduces the difference in a refractive index between the light emitting device 500, the lens member 400, and/or a background material, thus improving light extraction efficiency.

The cavity of the body part 100 may be filled with the liquid-phase or gel-phase molding member 300, and the lens member 400 may be provided on the body part 100. The lens member 400 may be provided on the top surface 130 of the body part 100 so that the lens member 400 may be supported on the top surface 130 of the body part. Thus, the width of the lens member 400 may be wider than that of the cavity.

The lens member 400 has a bottom surface to cover the cavity of the body part 100. An upper portion of the lens member 400 may have a dome shape as shown in FIG. 6, so that the light extraction efficiency can be improved.

Figure 7:
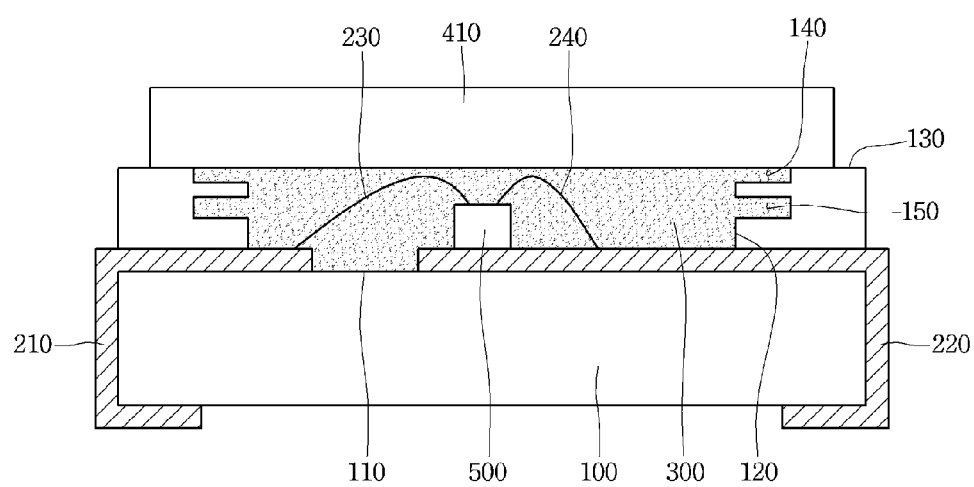
FIG. 7 is a sectional view showing a light emitting device package including a lens member according to still another embodiment.

FIG. 7 is a sectional view showing a light emitting device package including a lens member. A lens member 410 according to still another embodiment may have a plate shape. The lens member 410 having the plate shape may have a wider area for extracting light.

Making the light emitting device package may be easier, light extraction efficiency may be improved, and manufacturing costs may be lowered if the liquid-phase or gel-phase molding member 300 is used. In addition, the heat radiation characteristics of the light emitting device 500 may be improved.

However, after the gel-phase or liquid-phase molding member 300 has filled the cavity of the body part 100, the lens member 410 may cover the cavity of the body part 100 and air bubbles may form in the molding member 300 (see FIG. 8). In addition, when the air bubbles are located above the light emitting device 500, the light emitted from the light emitting device 500 may not pass through the air bubbles so light emission efficiency may decline.

When the lens member 410 covers the cavity of the body part 100 after the gel-phase or liquid-phase molding member 300 has been filled in the cavity of the body part 100, the molding member 300 may flow over the top surface 130 of the body part 100.

In order to solve the above problem, an air trap part may be formed around an upper portion of the cavity of the package. When the air trap part formed around the upper portion of the cavity covers the lens member 410, the air trap part may prevent the molding member 300 from flowing over the molding member 300. When air bubbles are located at the peripheral portion of the air trap part, the air trap part traps the air bubbles to prevent air bubbles from being located above the light emitting device 500.

The air trap part may include a first groove 140 and a second groove 150. The first groove 140 may be interposed between the body part 100 and the lens member 410. For example, the first groove 140 may be formed as a horizontal width of the cavity is expanded at an upper end of the internal lateral side 120 of the body part 100, and the expanded width of the cavity is covered by the bottom surface of the lens member 400. In other words, the first groove 140 may be horizontally recessed from the internal lateral side 120 of the body part 100. Since the first groove 140 may receive the molding member 300 filling the cavity, the molding member 300 may be prevented from flowing over the top surface 130 of the body part 100.

The second groove 150 may be provided in the internal lateral side 120 of the body part 100. For example, the second groove 150 may be formed in an upper portion of the internal lateral side 120 of the body part 100 in a horizontal direction. The second groove 150 may be below the first groove 140. The second groove 150 receives the molding member 300 filling the cavity, so that the molding member 300 may be prevented from flowing over the top surface 130 of the body part 100.

Figure 9:
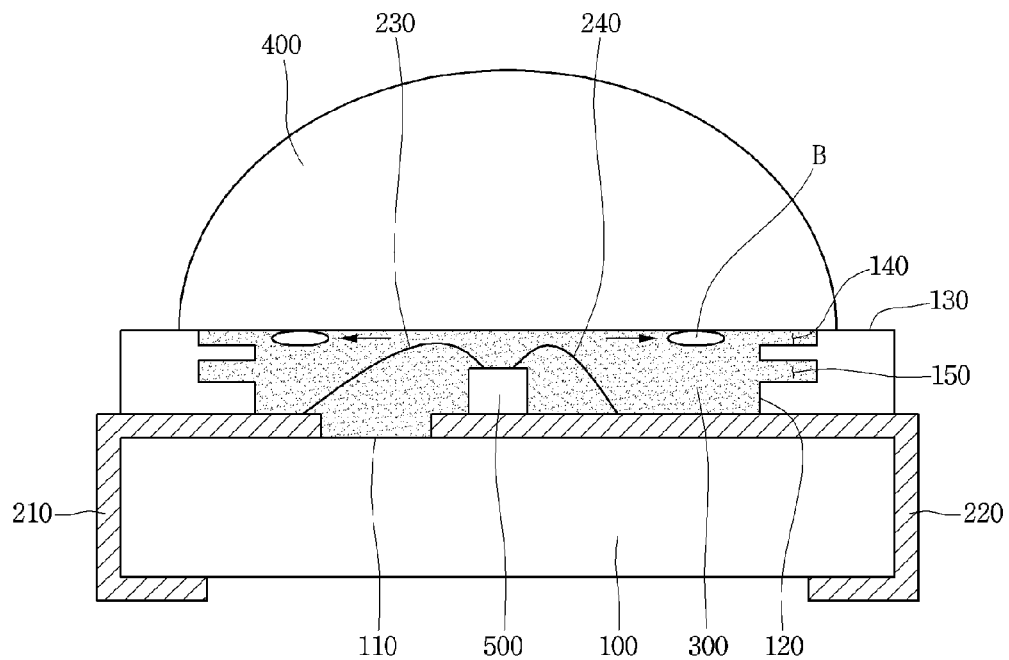
Figure 10:
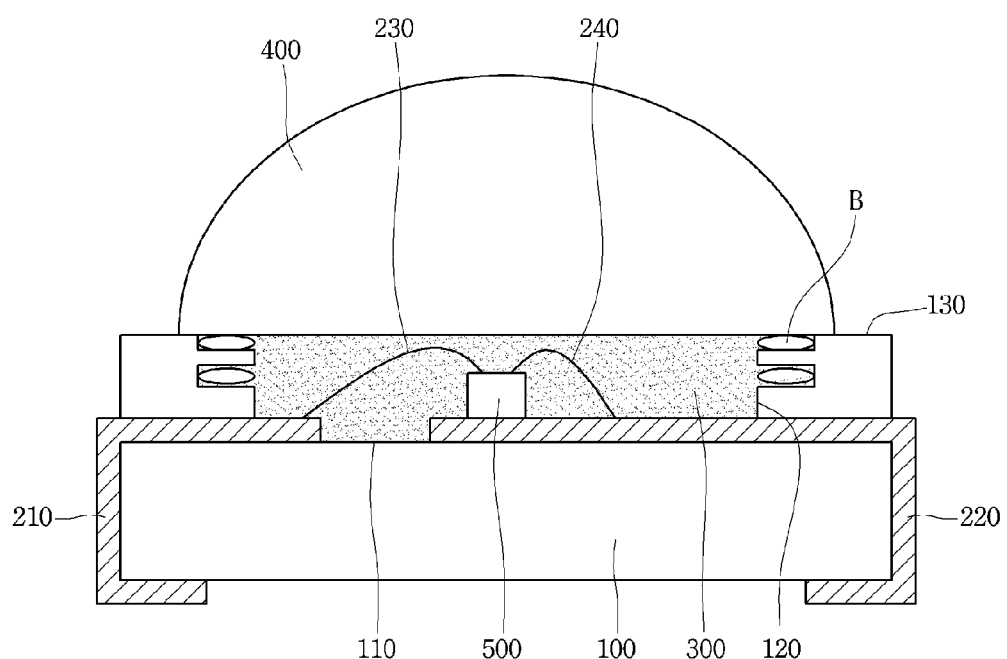

FIGS. 8 to 10 are views showing procedures of trapping air bubbles by an air trap part. As shown in FIG. 8, air bubbles B may form on the light emitting device 500 when a lens covers the cavity of the body part 100 after the molding member 300 has filled in the cavity of the body part 100. When the air bubbles B are located on the light extraction path of the light emitting device 500, the light may be reflected so that the light extraction efficiency decreases.

Referring to FIG. 9, when predetermined time has elapsed after the light emitting device 500 is in use, heat may be emitted from the light emitting device 500 to heat the molding member 300 around the light emitting device 500, and the air bubbles B may be moved to a lateral-side circumference of the body part 100 due to the convection of the molding member 300. The air bubbles B may move away from the light extraction path of the light emitted from the light emitting device 500 so that the light extraction efficiency may temporarily improve. However, the air bubbles B may randomly move to the light extraction path of the light emitting device 500 due to convection of the molding member 300.

As shown in FIG. 10, the moved air bubbles B are trapped by the air trap part at the internal lateral side 120 of the body part 100. Since the upper circumference of the internal lateral side 120 of the body part 100 is away from the light extraction path, the light extraction efficiency of the light emitting device 500 may be significantly improved by removing the air bubbles B from the light extraction path.

Figure 11:
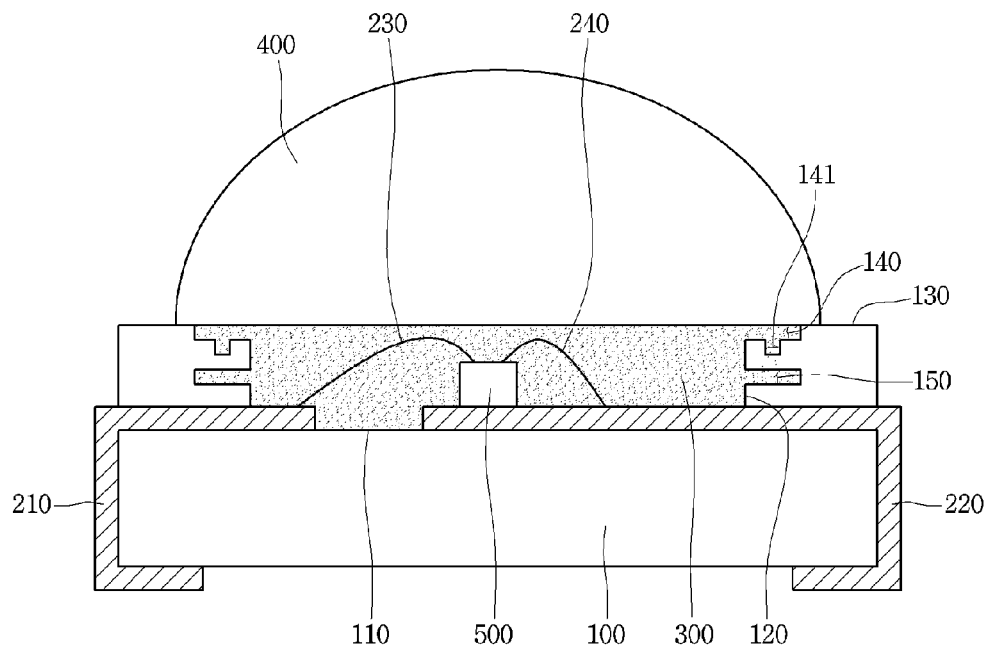
FIG. 11 is a sectional view showing a light emitting device package according to still another embodiment.

FIG. 11 is a sectional view showing a light emitting device package according to still another embodiment. The light emitting device package may include a body part 100 including a cavity, first and second electrodes 210 and 220 provided on the body part 100, the light emitting device 500 provided on the body part 100 and electrically connected to the first and second electrodes 210 and 220, a molding member 300 that surrounds the light emitting device 500, a lens member 400 provided on the body part 100, and an air trap part.

The air trap part according to the embodiment may include a first groove 140, a second groove 150, and a third groove 141. The first groove 140 may be interposed between the body part 100 and the lens member 400. For example, the first groove 140 may be formed as a horizontal width of the cavity is expanded at an upper end of the internal lateral side 120 of the body part 100, and the expanded width of the cavity is covered by the bottom surface of the lens member 400. In other words, the first groove 140 may be horizontally recessed in the internal lateral side 120 of the body part 100.

The second groove 150 may be provided in the internal lateral side 120 of the body part 100. For example, the second groove 150 may be horizontally recessed in the upper portion of the internal lateral side 120 of the body part 100. The second groove 150 may be provided under the first groove 140.

The third groove 141, which may be vertically recessed, may also form in one side of the first groove 140. For example, the third groove 141 may be recessed toward the second groove 150 from one side of the body part 100 having the first groove 140. The third groove 141 may receive the molding member 300 to prevent the molding member 300 from overflowing. In addition, the third groove 141 may trap air bubbles moving through the first groove 140. The air trap part having the above structure may more effectively trap the air bubbles moving along the circumference of the cavity and remove the air bubbles from the light extraction path, thereby significantly improving the light extraction efficiency.

Figure 12:
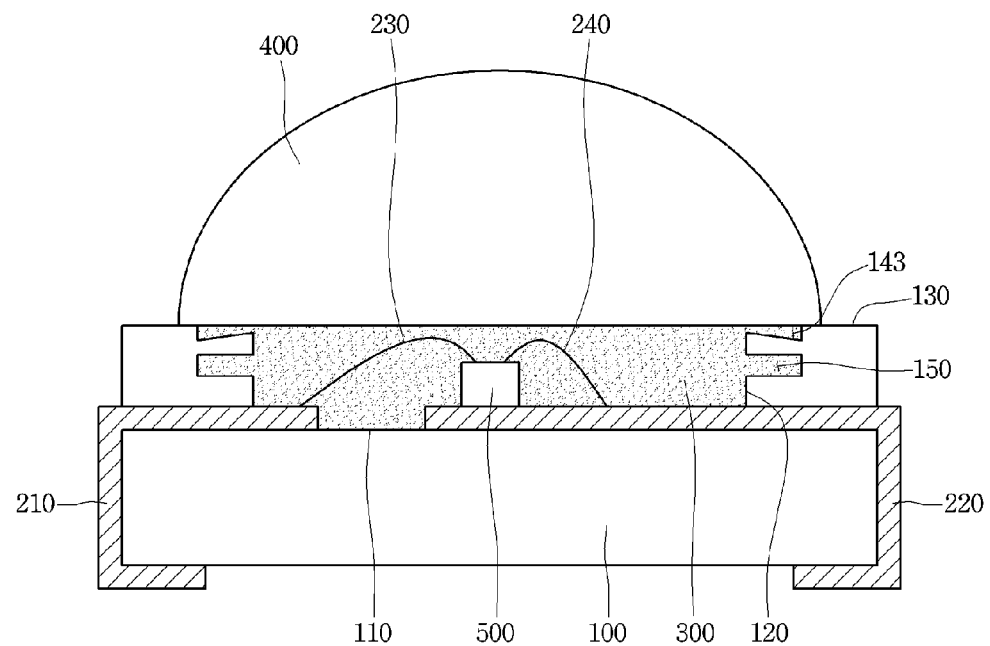
FIG. 12 is a sectional view showing a light emitting device package according to still another embodiment.

FIG. 12 is a sectional view showing a light emitting device package according to still another embodiment. The light emitting device package may include a body part 100 including a cavity, first and second electrodes 210 and 220 provided on the body part 100, the light emitting device 500 provided on the body part 100 and electrically connected to the first and second electrodes 210 and 220, a molding member 300 that surrounds the light emitting device 500, a lens member 400 provided on the body part 100, and an air trap part.

The air trap part according to the embodiment may include a first groove 143 and a second groove 150. The first groove 143 may be interposed between the body part 100 and the lens member 400. For example, the first groove 143 may be formed as a horizontal width of the cavity is expanded at an upper end of the internal lateral side 120 of the body part 100, and the expanded width of the cavity is covered by the bottom surface of the lens member 400. In other words, the first groove 143 may be horizontally recessed in the internal lateral side 120 of the body part 100.

The first groove 143 may be gradually enlarged as the first groove 143 horizontally extends. In other words, the first groove 143 may be smaller vertically at the internal lateral side 120 of the body part 100 and may be bigger vertically away from the internal lateral side 120.

The second groove 150 may be provided in the internal lateral side 120 of the body part 100. For example, the second groove 150 may be horizontally recessed in the upper portion of the internal lateral side 120 of the body part 100. The second groove 150 may be provided under the first groove 143. The air trap part having the above structure may more effectively trap the air bubbles moving along the circumference of the cavity and remove the air bubbles from the light extraction path, thereby significantly improving the light extraction efficiency.

Figure 13:
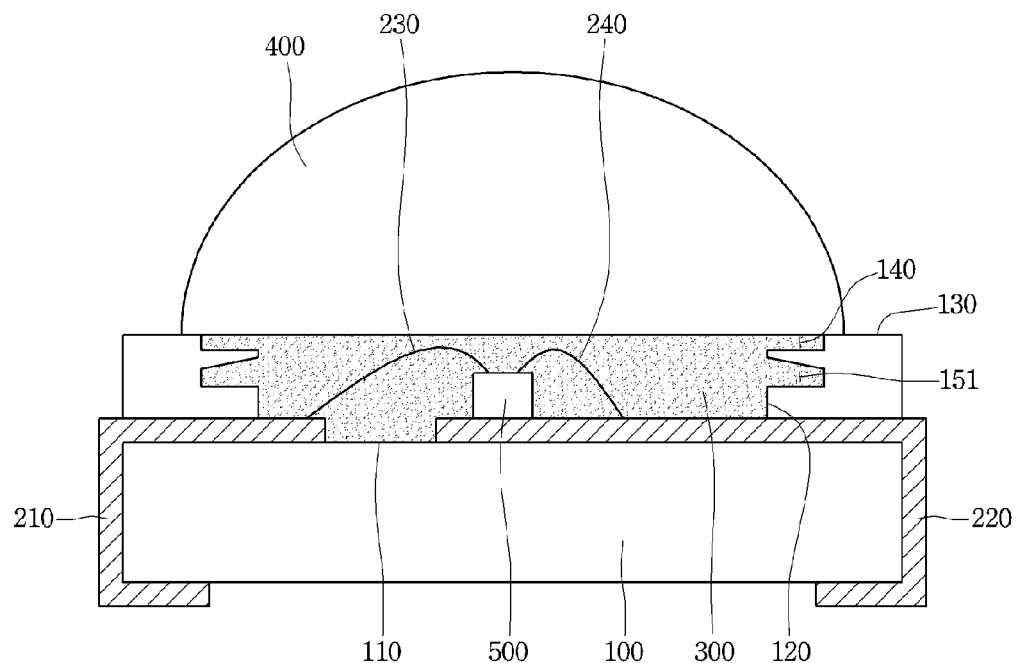
FIG. 13 is a sectional view showing a light emitting device package according to still another embodiment.

FIG. 13 is a sectional view showing a light emitting device package according to still another embodiment. The light emitting device package may include a body part 100 including a cavity, first and second electrodes 210 and 220 provided on the body part 100, the light emitting device 500 provided on the body part 100 and electrically connected to the first and second electrodes 210 and 220, a molding member 300 that surrounds the light emitting device 500, a lens member 400 provided on the body part 100, and an air trap part.

The air trap part according to the embodiment may include a first groove 140 and a second groove 151. The first groove 140 may be interposed between the body part 100 and the lens member 400. For example, the first groove 140 may be formed as a horizontal width of the cavity is expanded at an upper end of the internal lateral side 120 of the body part 100, and the expanded width of the cavity is covered by the bottom surface of the lens member 400. In other words, according to the embodiment, the first groove 140 may be horizontally recessed in the internal lateral side 120 of the body part 100.

The second groove 151 may be provided in the internal lateral side 120 of the body part 100. For example, the second groove 150 may be horizontally recessed in the upper portion of the internal lateral side 120 of the body part 100. The second groove 151 may be gradually reduced in size as the second groove 151 horizontally extends. The top surface 130 of the body part 100 constituting the second groove 151 is inclined so that the size of the second groove 151 may be gradually reduced.

The second groove 151 allows the air bubbles that have moved up in the cavity to smoothly move into the second groove 151, so that the air bubbles may be more effectively trapped. Therefore, the air trap part may more effectively trap the air bubbles moving along the circumference of the cavity and remove the air bubbles from the light extraction path, thereby significantly improving the light extraction efficiency.

Figure 14:
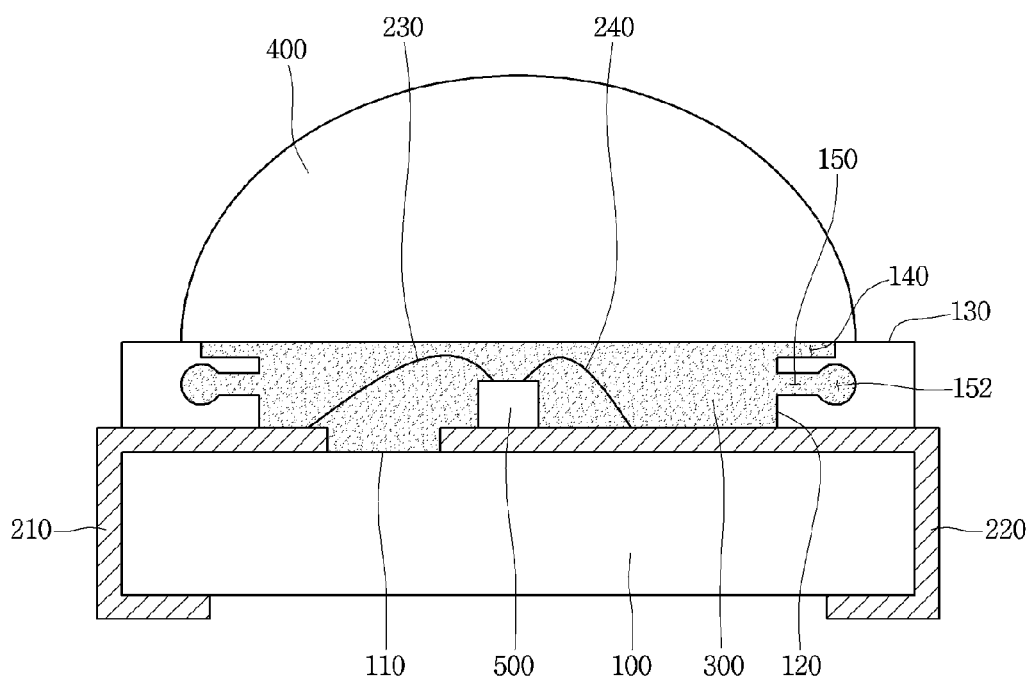
FIG. 14 is a sectional view showing a light emitting device package according to still another embodiment.

FIG. 14 is a sectional view showing a light emitting device package according to still another embodiment. The light emitting device package may include a body part 100 including a cavity, first and second electrodes 210 and 220 provided on the body part 100, the light emitting device 500 provided on the body part 100 and electrically connected to the first and second electrodes 210 and 220, a molding member 300 that surrounds the light emitting device 500, a lens member 400 provided on the body part 100, and an air trap part.

The air trap part according to the embodiment may include a first groove 140, a second groove 150, and an air bubble receiving part 152. The first groove 140 may be interposed between the body part 100 and the lens member 400. For example, the first groove 140 may be formed as a horizontal width of the cavity is expanded at an upper end of the internal lateral side 120 of the body part 100, and the expanded width of the cavity is covered by the bottom surface of the lens member 400. In other words, according to the embodiment, the first groove 140 may be horizontally recessed in the internal lateral side 120 of the body part 100.

The second groove 150 may be provided in the internal lateral side 120 of the body part 100. For example, the second groove 150 may be horizontally recessed in an upper portion of the internal lateral side 120 of the body part 100. The second groove 150 may be provided under the first groove 140.

In addition, the air bubble receiving part 152 may be provided at an end portion of the second groove 150. For example, the air bubble receiving part 152 may correspond to a large space provided in the end portion of the second groove 150. In other words, the air bubble receiving part 152 may provide a larger space than the second groove 150 at an end portion of the second groove 150 as the second groove 150 horizontally extends.

The air bubble receiving part 152 may more strongly trap air bubbles that have moved through the second groove 150 and prevent the air bubbles from escaping from the air bubble receiving part 152, even if impact is applied to the light emitting device package afterward. The air trap part according to the embodiment may more effectively trap the air bubbles moving along the circumference of the cavity and remove the air bubbles from the light extraction path, thereby significantly improving the light extraction efficiency.

Figure 15:
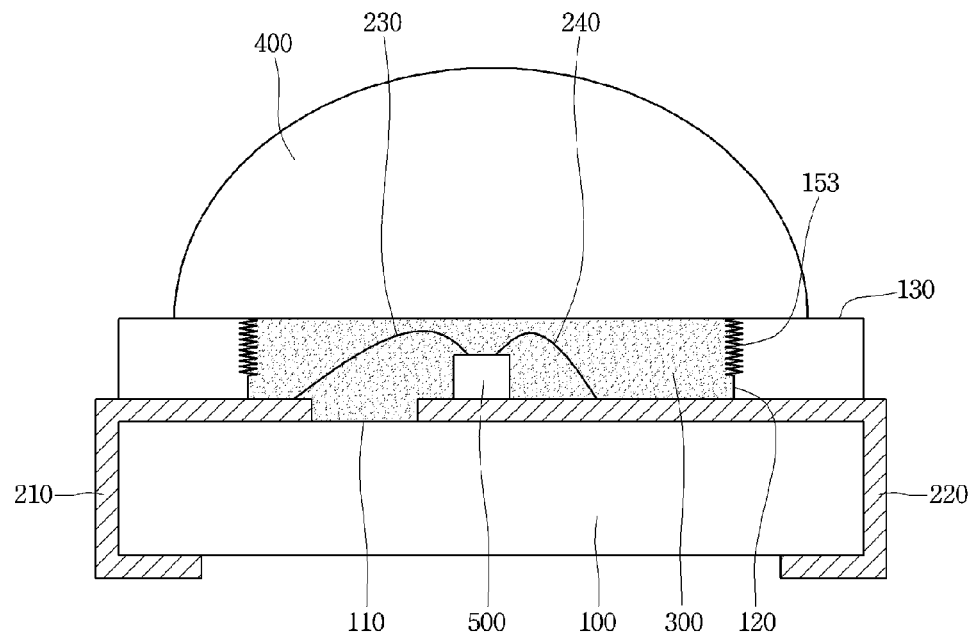
FIG. 15 is a sectional view showing a light emitting device package according to still another embodiment.

FIG. 15 is a sectional view showing a light emitting device package according to still another embodiment. The light emitting device package may include a body part 100 including a cavity, first and second electrodes 210 and 220 provided on the body part 100, the light emitting device 500 provided on the body part 100 and electrically connected to the first and second electrodes 210 and 220, a molding member 300 that surrounds the light emitting device 500, a lens member 400 provided on the body part 100, and an air trap part.

The air trap part according to the embodiment may include a concavo-convex part 153. The concavo-convex part 153 may be formed at the circumference of the body part 100. In detail, the concavo-convex part 153 may be formed at the internal lateral side 120 of the body part 100. Further, the concavo-convex part 153 may be formed at the upper portion of the internal lateral side 120 of the body part 100. The concavo-convex part 153 may be easily manufactured. The air trap part according to the embodiment may more effectively trap the air bubbles moving along the circumference of the cavity and remove the air bubbles from the light extraction path, thereby significantly improving the light extraction efficiency.

Figure 16:
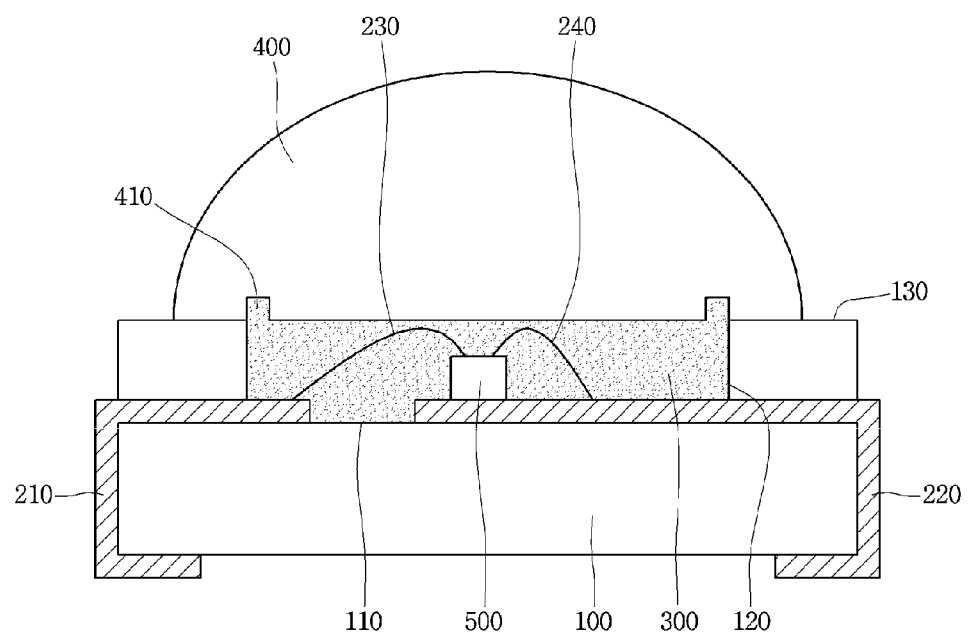
FIG. 16 is a sectional view showing a light emitting device package according to still another embodiment.

FIG. 16 is a sectional view showing a light emitting device package according to still another embodiment. The light emitting device package may include a body part 100 including a cavity, first and second electrodes 210 and 220 provided on the body part 100, the light emitting device 500 provided on the body part 100 and electrically connected to the first and second electrodes 210 and 220, a molding member 300 to surround the light emitting device 500, a lens member 400 provided on the body part 100, and an air trap part.

The air trap part may be a groove 410 formed in the lens member 400. For example, the air trap part may be the groove 410 vertically formed in an area of the lens member 400 arranged at the circumference of the cavity of the body part 100. In other words, the air trap part may be the groove 410 formed in the bottom surface of the lens member 400 close to the circumference of the cavity of the body part 100.

The second groove 151 may allow the air bubbles that have moved to the circumference of the cavity of the body part 100 to move into the groove 410 of the lens member 400, so that the air bubbles may move away from the light extraction path. The air trap part according to the embodiment may more effectively trap the air bubbles moving along the circumference of the cavity and remove the air bubbles from the light extraction path, thereby significantly improving the light extraction efficiency.

Figure 17:
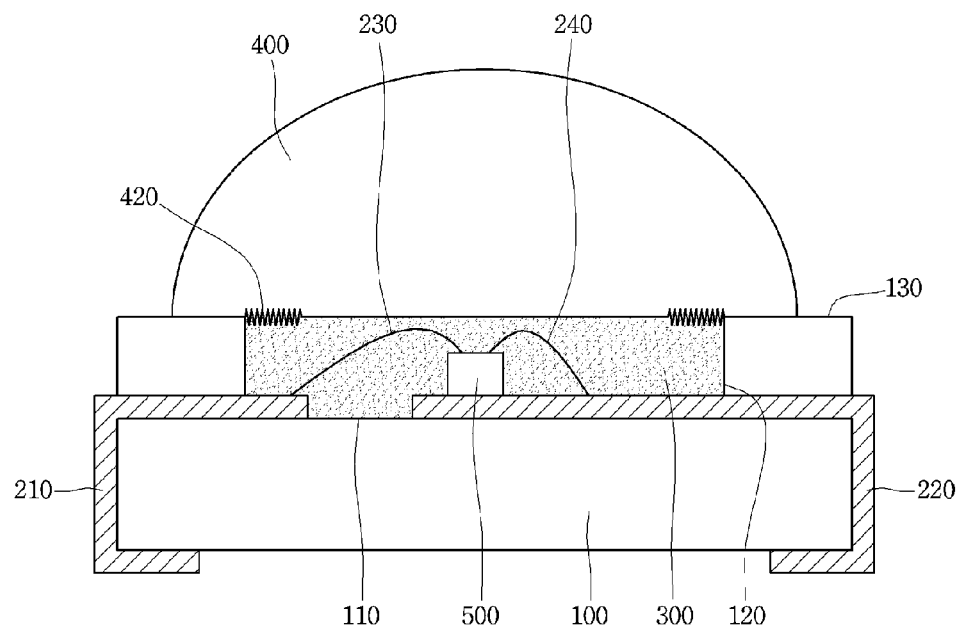
FIG. 17 is a sectional view showing a light emitting device package according to still another embodiment.

FIG. 17 is a sectional view showing a light emitting device package according to still another embodiment. The light emitting device package may include a body part 100 including a cavity, first and second electrodes 210 and 220 provided on the body part 100, the light emitting device 500 provided on the body part 100 and electrically connected to the first and second electrodes 210 and 220, a molding member 300 that surrounds the light emitting device 500, a lens member 400 provided on the body part 100, and an air trap part.

The air trap part according to the embodiment may be a concavo-convex structure formed at the lens member 400. For example, the air trap part may be the concavo-convex structure formed at the area of the lens member 400 arranged at the circumference of the cavity of the body part 100. In other words, the air trap part may be the concavo-convex structure formed on the bottom surface of the lens member 400 close to the circumference of the cavity of the body part 100.

The air trap part may trap the air bubbles that have moved to the circumference of the cavity of the body part 100 through the concavo-convex structure, so that the air bubbles may move away from the light extraction path. The air trap part according to the embodiment may more effectively trap the air bubbles moving along the circumference of the cavity and remove the air bubbles from the light extraction path, thereby significantly improving the light extraction efficiency.

Figure 18:
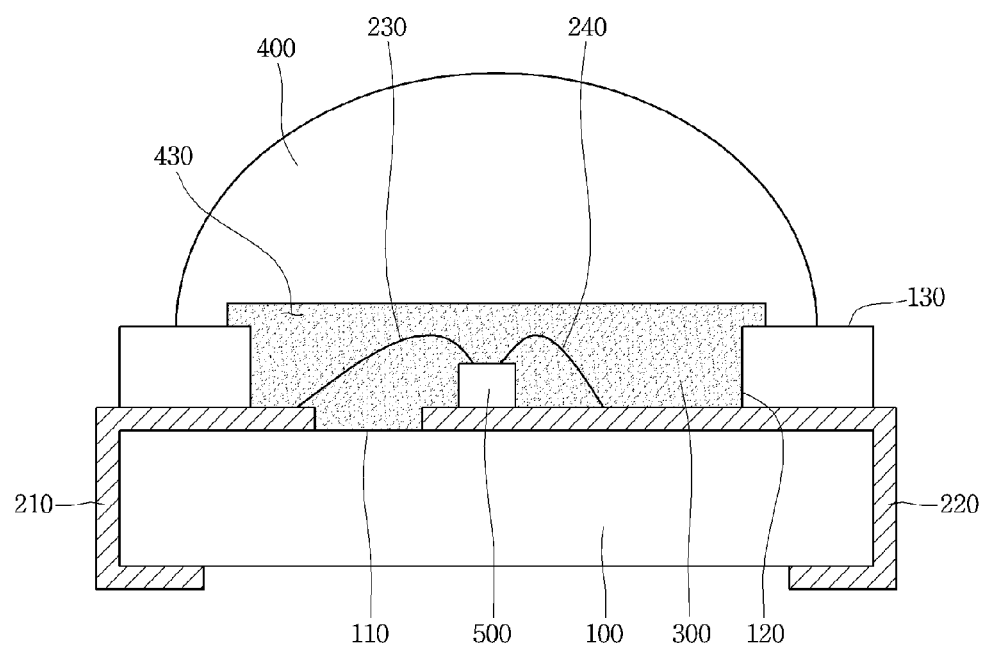
FIG. 18 is a sectional view showing a light emitting device package according to still another embodiment.

FIG. 18 is a sectional view showing a light emitting device package according to still another embodiment. The light emitting device package may include a body part 100 including a cavity, first and second electrodes 210 and 220 provided on the body part 100, the light emitting device 500 provided on the body part 100 and electrically connected to the first and second electrodes 210 and 220, a molding member 300 that surrounds the light emitting device 500, a lens member 400 provided on the body part 100, and an air trap part.

The air trap part according to the embodiment may be a groove 430 formed in the lens member 400. For example, the air trap part may be the groove 430 of the lens member 400 having a width greater than that of the cavity.

If the lens member 400 having the groove 430 is provided on the body part 100, a concavo-convex structure (not shown) may be horizontally formed between the top surface 130 of the body part 100 and the groove 430 of the lens member 400 and at the area of the lens member 400 at the circumference of the cavity of the body part 100. In other words, the air trap part may be the concavo-convex structure formed on the bottom surface of the lens member 400 close to the circumference of the cavity of the body part 100.

The air trap part may trap the air bubbles that have moved to the circumference of the cavity of the body part 100 through the concavo-convex structure, so that the air bubbles may move away from the light extraction path. The air trap part according to the embodiment may more effectively trap the air bubbles moving along the circumference of the cavity and remove the air bubbles from the light extraction path, thereby significantly improving the light extraction efficiency.

The light emitting device package may be applied to a light unit. The light unit may include a structure in which a plurality of light emitting device packages are arrayed and may include a light, a traffic light, a vehicle headlight, and an electronic board.

The embodiment provides a light emitting device package capable of reducing light loss and improving reliability and a light system including the same.

The embodiment provides a light emitting device package capable of improving the light emission efficiency and a light system including the same.

A light emitting device package may include a package body, a light emitting device on the package body, a first molding member surrounding the light emitting device, and a second molding member having a hemi-spherical structure to surround the first molding member. The first molding member may include a viscous material.

A body part may include a cavity having a bottom surface and an internal lateral side, first and second electrodes on the body part, a light emitting device provided on the bottom surface of the body part and electrically connected to the first electrode and the second electrode, a liquid-phase or gel-phase molding member provided in a cavity of the body part to surround the light emitting device, a lens member on the body part, and an air trap part at an internal lateral side of the body part which forms an upper circumference of the cavity of the body part.

A light emitting device package may include a body part including a cavity having a bottom surface and an internal lateral side, first and second electrodes on the body part, a light emitting device provided on the bottom surface of the body part and electrically connected to the first electrode and the second electrode, a liquid-phase or gel-phase molding member provided in a cavity of the body part to surround the light emitting device, a lens member on the body part, and an air trap part on a bottom surface of the lens member that overlaps with an upper circumference of the cavity of the body part.

A light system according to the embodiment may include a light emitting unit including the light emitting device package.

The loss in the quantity of light can be reduced and reliability can be improved by including the molding member having viscosity.

Molding members may protect the light emitting device and may provide for a lower priced light emitting device package.

The light emitted from the light emitting device may be efficiently extracted through the liquid-phase molding member or the gel-phase molding member so that the intensity of light can be improved.

The air trap part may prevent the molding member from overflowing when the lens member is provided on the body part. Further, the air trap part may remove air bubbles from the light extraction path so that the light extraction efficiency may be improved.

The light emitting device package may simplify the fabrication process thereof and lower the fabrication cost thereof.

It will be understood that, when a layer (or film), an area, a pattern, or a structure is referred to as being "on" or "under" another substrate, another layer (or film), another area, another pad, or another pattern, it can be "directly" or "indirectly" over the other substrate, layer (or film), area, pad, or pattern, or one or more intervening layers may also be present. Such a position of the layer has been described with reference to the drawings.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a body part including a cavity having a bottom surface and an internal lateral side;
a first electrode and a second electrode on the body part;
a light emitting device provided on a bottom surface of the body part and electrically connected with the first electrode and the second electrode;
a molding member provided in the cavity of the body part to surround the light emitting device; and
a lens member on the body part,
wherein the lens member has an air trap part,
wherein the air trap part is a groove formed in a bottom surface of the lens member and above a top surface of the molding member,
wherein the air trap part is disposed on the outer periphery of the upper surface of the molding member,
wherein the groove of the air trap part is vertically formed in an area of the lens member provided at a circumference of the cavity of the body part, and
wherein the air trap part does not vertically overlap the light emitting device.

2. The light emitting device package of claim 1, wherein the groove is vertically formed in an area of the lens member arranged at the circumference of the cavity of the body part.

3. The light emitting device package of claim 1, wherein the groove is formed in the bottom surface of the lens member corresponding to the circumference of the cavity of the body part.

4. The light emitting device package of claim 1, wherein the lens member has a bottom surface to cover the cavity of the body part.

5. The light emitting device package of claim 1, wherein an upper portion of the lens member has a dome shape.

6. The light emitting device package of claim 1, wherein the molding member includes a liquid-phase material or gel-phase material.

7. The light emitting device package of claim 1, wherein the molding member includes a silicon or epoxy.

8. The light emitting device package of claim 1, wherein the molding member has the refractive index in the range of 1.2 to 1.7.

9. The light emitting device package of claim 1, wherein the groove of the air trap part is formed in the bottom surface of the lens member corresponding to the circumference of the cavity of the body part.

10. The light emitting device package of claim 9, wherein the air trap part is provided along the circumference of the cavity of the body part and away from a light extraction path of the light emitting device.

11. The light emitting device package of claim 10, wherein the filling agent includes at least one of $Al_2O_3$ or $TiO_2$.

12. The light emitting device package of claim 9, wherein the molding member includes a filling agent.

* * * * *